(12) United States Patent
Han et al.

(10) Patent No.: US 8,895,954 B2
(45) Date of Patent: Nov. 25, 2014

(54) LIGHT EMITTING DIODE PACKAGE

(75) Inventors: Kyoung-Bo Han, Seoul (KR);
Seung-Ho Jang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 311 days.

(21) Appl. No.: 13/330,333

(22) Filed: Dec. 19, 2011

(65) Prior Publication Data

US 2013/0043494 A1 Feb. 21, 2013

(30) Foreign Application Priority Data

Aug. 18, 2011 (KR) .......................... 10-2011-0082269

(51) Int. Cl.
| | |
|---|---|
| *H01L 29/06* | (2006.01) |
| *H01L 25/075* | (2006.01) |
| *H01L 33/62* | (2010.01) |
| *H01L 33/60* | (2010.01) |

(52) U.S. Cl.
CPC ............. *H01L 25/0753* (2013.01); *H01L 33/62* (2013.01); *H01L 33/60* (2013.01); *H01L 2224/48247* (2013.01)
USPC ............................................... 257/9; 257/13

(58) Field of Classification Search
CPC ..... H01L 27/15; H01L 27/153; H01L 27/156; H01L 33/38
USPC .......................................................... 257/3, 14
See application file for complete search history.

(56) References Cited

U.S. PATENT DOCUMENTS

2010/0157595 A1* 6/2010 Lin et al. ....................... 362/235

FOREIGN PATENT DOCUMENTS

| CN | 101127350 A | 2/2008 |
|---|---|---|
| CN | 102142507 A | 8/2011 |
| TW | 201121108 A1 | 6/2011 |

* cited by examiner

*Primary Examiner* — Jae Lee
(74) *Attorney, Agent, or Firm* — Birch, Stewart, Kolasch & Birch, LLP

(57) ABSTRACT

The present invention relates to a light emitting diode package which can reduce a wire length, and can improve heat and light resistance. The light emitting diode package includes a molded portion having a housing, a plurality of light emitting chips housed in the housing, a plurality of main lead portions having the plurality of light emitting chips mounted thereto respectively, at least one sub-lead portion formed spaced from the main lead portions and electrically connected to at least any one of the plurality of main lead portions and the plurality of light emitting chips with a wire for electrically connecting the plurality of light emitting chips each other.

8 Claims, 4 Drawing Sheets

LIGHT EMITTING DIODE PACKAGE

CROSS REFERENCE TO RELATED APPLICATION

This application claims the benefit of the Korean Patent Application No. 10-2011-0082269, filed on Aug. 18, 2011, which is hereby incorporated by reference as if fully set forth herein.

BACKGROUND OF THE DISCLOSURE

1. Field of the Disclosure

The present invention relates to a light emitting diode package which can reduce a wire length, and can improve heat and light resistance.

2. Discussion of the Related Art

The light emitting diode is a kind of semiconductor for converting an electric signal into a light by using a compound semiconductor characteristic. Since the light emitting diode has many advantages, such as high light emitting efficiency, a long lifetime, low power consumption, and environment friendly, it is a trend that technical application fields of the light emitting diode increase day by day. The light emitting diode is formed in a package structure which includes light emitting chips.

In order to increase a light emitting quantity, a related art light emitting diode package has a plurality of the light emitting chips mounted in a housing of a molded portion. However, since a light from the plurality of the light emitting chips is absorbed to, or reflected at, adjacent light emitting chip, a problem is caused, in which optical interference takes place among the light emitting chips.

If a distance between the light emitting chips is made far, a length of the wire which electrically connects the light emitting chips together becomes longer. The long length of wire causes breakage of the wire due to stress applied to the wire at the time of contraction or expansion of the wire by heat from the light emitting chips.

SUMMARY OF THE DISCLOSURE

Accordingly, the present invention is directed to a light emitting diode package.

An object of the present invention is to provide a light emitting diode package which enables to reduce a length of a wire and improve heat resistance and light resistance.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting diode package includes a molded portion having a housing, a plurality of light emitting chips housed in the housing, a plurality of main lead portions on which the plurality of light emitting chips is mounted, at least one sub-lead portion formed spaced from the main lead portions and electrically connected to at least any one of the plurality of main lead portions and the plurality of light emitting chips with a wire for electrically connecting the plurality of light emitting chips each other.

The light emitting diode package further includes first space maintaining portions formed such that the plurality of light emitting chips respectively on the plurality of main lead portions are opposite to one another with one of the first space maintaining portions disposed therebetween, and second space maintaining portions formed on both sides of each of the first space maintaining portions, wherein the first and second space maintaining portions are formed of a material the same with the molded portion, and each of the second space maintaining portions is formed between each of the plurality of main lead portions and the sub-lead portion, or on a bottom of each of the sub-lead portions between the plurality of main lead portions.

The plurality of light emitting chips include first and second light emitting chips, the plurality of main lead portions include a first main lead portion on which the first light emitting chip is mounted, and a second main lead portion on which the second light emitting chip is mounted, and at least one of the sub-lead portion includes first and second sub-lead portions positioned on both sides of a space between the first and second main lead portions.

In this instance, the first and second light emitting chips are connected in series as the first light emitting chip has a first terminal connected to an anode through the first main lead portion, the first light emitting chip has a second terminal and the second light emitting chip has a first terminal, both connected to the first sub-lead portion or the second sub-lead portion, and the second light emitting chip has the second terminal connected to a cathode through the second main lead portion, and the first and second light emitting chips are connected in parallel as the first light emitting chip has the first terminal connected to the anode through the first main lead portion, the first light emitting chip has the second terminal connected to the cathode through the first sub-lead portion and the second main lead portion, the second light emitting chip has the first terminal connected to the anode through the second sub-lead portion and the first main lead portion, and the second light emitting chip has the second terminal connected to the cathode through the second main lead portion.

The plurality of light emitting chips include first to third light emitting chips, the plurality of main lead portions include the first main lead portion on which the first light emitting chip is mounted, the second main lead portion on which the second light emitting chip is mounted, and a third main lead portion on which the third light emitting chip is mounted, and at least one of the sub-lead portion includes first and third sub-lead portions positioned on both sides of a space between the first and second main lead portions, and second and fourth sub-lead portions positioned on both sides of a space between the second and third main lead portions.

In this instance, the first to third light emitting chips are connected in parallel as the first light emitting chip has the first terminal connected to the anode through the first main lead portion, the first light emitting chip has the second terminal connected to the cathode through the third and fourth sub-lead portions and the third main lead portion, the second light emitting chip has the first terminal connected to the anode through the first sub-lead portion and the first main lead portion, the second light emitting chip has the second terminal connected to the cathode through the fourth sub-lead portion and the third main lead portion, the third light emitting chip has a first terminal connected to the anode through the first and second sub-lead portions and the first main lead portion, and the third light emitting chip has a second terminal connected to a cathode through the third main lead portion.

In the meantime, the light emitting diode package further includes a reflective portion formed of a material the same with the molded portion or the main lead portion on the first space maintaining portion or the first and second space maintaining portions.

And, the light emitting diode package further includes a first reflective portion formed of a material the same with the molded portion on the first space maintaining portion or the first and second space maintaining portions, and a second reflective portion formed of a material the same with the main lead portion as one unit with the main lead portion on a reflective surface of the first reflective portion.

The light emitting diode package further includes a third reflective portion formed of a material the same with the main lead portion as one unit with the main lead portion on a side of the molded portion.

And, the second and third reflective portions are projected higher than an upper side of the main lead portion on which the light emitting chip is mounted.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
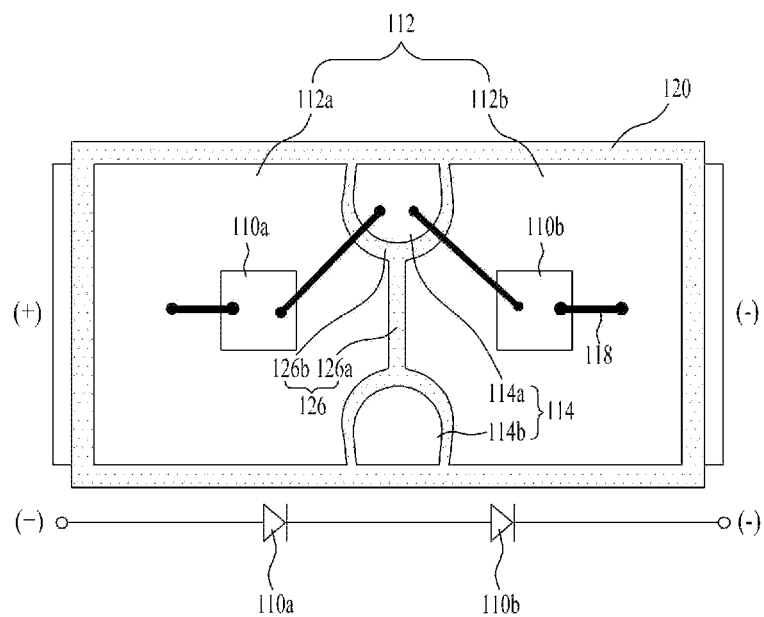
FIG. 1 illustrates a plan view of a light emitting diode package in accordance with a first preferred embodiment of the present invention.
Figure 2:
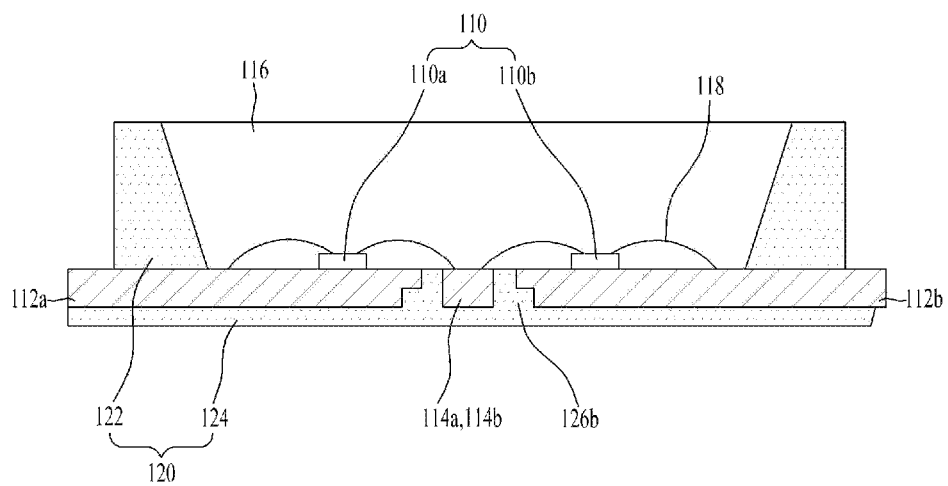
FIG. 2 illustrates a section along wires in the light emitting diode package in FIG. 1.

FIG. 1 illustrates a plan view of a light emitting diode package in accordance with a first preferred embodiment of the present invention, and FIG. 2 illustrates a section along wires in the light emitting diode package in FIG. 1.

Referring to FIGS. 1 and 2, the light emitting diode package includes a plurality of light emitting chips 110, a plurality of main lead portions 112, a plurality of sub-lead portions 114, and a molded portion 120, and a sealing portion 116.

The plurality of light emitting chips 110 are housed in a housing formed by the molded portion 120, connected to at least one of the plurality of main lead portions 112 and the plurality of sub-lead portions 114 with wires. Accordingly, the light emitting chips 110 generate lights according to a driving signal transmitted from a printed circuit board through the main lead portions 112 and the sub-lead portions 114.

Figure 5:
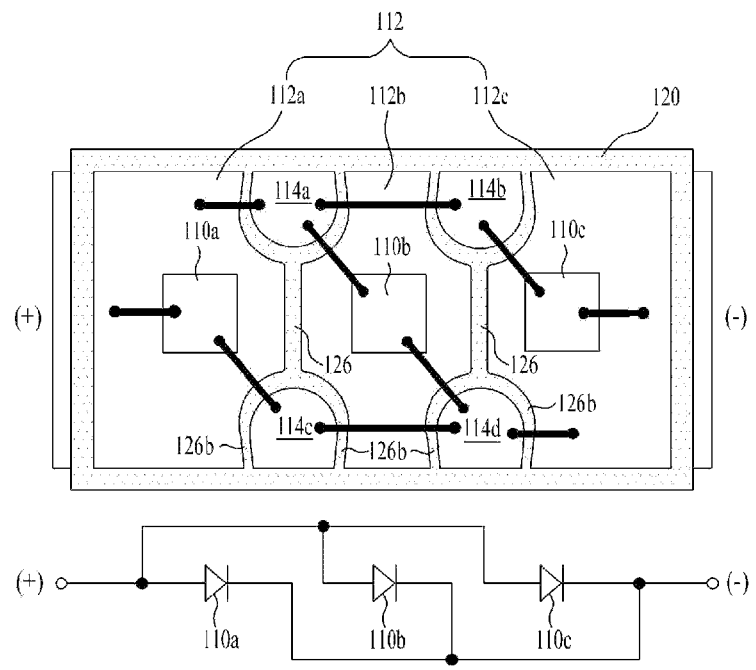
FIG. 5 illustrates a plan view showing a structure in which first to third light emitting chips in a light emitting diode package in accordance with a preferred embodiment of the present invention are connected in parallel.

The plurality of main lead portions 112 transmit the driving signal from the printed circuit board to an anode and cathode of each of the light emitting chips 110. To do this, one of the light emitting chips 110 is mounted on each of the main lead portions 112. That is, a number of the plurality of main lead portions 112 are the same with a number of the plurality of light emitting chips 110 housed in the same housing. For an example, as shown in FIG. 1, if first and second light emitting chips 110a and 110b are housed in a housing formed by the molded portion 120, the first light emitting chip 110a is mounted on the first main lead portion 112a, and the second light emitting chip 110b is mounted on the second main lead portion 112b. And, as shown in FIG. 5, if first to third light emitting chips 110a, 110b, and 110c are housed in the housing formed by the molded portion 120, the first light emitting chip 110a is mounted on the first main lead portion 112a, the second light emitting chip 110b is mounted on the second main lead portion 112b, and the third light emitting chip 110c is mounted on the third main lead portion 112c.

Figure 3:
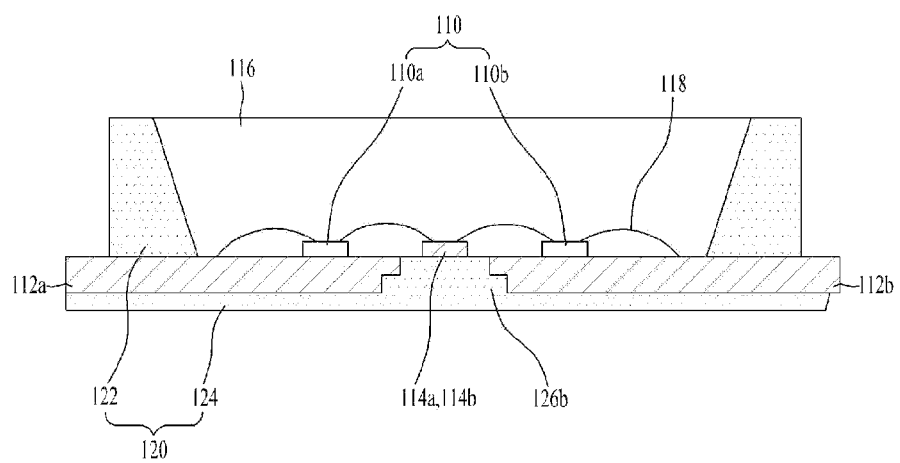
FIG. 3 illustrates a section showing another shape of the sub-lead portion in FIG. 2.

The sub-lead portion 114 is connected to at least one of the main lead portion 112, an adjacent sub-lead portion 114, and the light emitting chip 110 with the wires 118. As shown in FIG. 2 or 3, the sub-lead portion 114 is formed in a shape of an island spaced from the main lead portion 112 of a material the same with the main lead portion 112. The sub-lead portions 114a, and 114b shown in FIG. 2 are formed on a bottom 124 of the molded portion 120 spaced from the main lead portions 112 each with a second space maintaining portion 126b disposed therebetween. The sub-lead portions 114a, and 114b shown in FIG. 3 are formed on the second space maintaining portion 126b in a width smaller than the second space maintaining portion 126b, and the second space maintaining portion 126b is formed on the same plane with the main lead portions 112.

The molded portion 120 has sides 122 and a bottom 124 to provide a housing for housing the light emitting chips 110 therein.

The sides 122 of the molded portion 120 are formed to surround a region at which the plurality of light emitting chips 110 are to be formed. And, each of the sides 122 of the molded portion 120 is formed to have a sloped side with a width which becomes the smaller as the side 122 becomes the higher for reflecting the light from the light emitting chips 110.

The bottom 124 of the molded portion 120 supports the main lead portions 112 and the sub-lead portions 114. The first and second space maintaining portions 126a, and 126b are formed on the bottom 124 of the molded portion 120.

The plurality of light emitting chips 110 respectively on the plurality of main lead portions 112 are formed opposite to one another with one of the first space maintaining portions 126a disposed therebetween for increasing spaces among the light emitting chips 110. Thus, the light interference among the plurality of light emitting chips 110 are reduced, and the plurality of light emitting chips 110 which are heat sources are made to space from one another to enhance a heat dissipation effect.

The second space maintaining portion 126b is formed between the plurality of main lead portions 112 and the plurality of sub-lead portions 114 respectively, to form a U shape on both sides of the first space maintaining portion 126a. Accordingly, the second space maintaining portion 126b spaces each of the main lead portions 112 from each of the sub-lead portions 114, for preventing short circuiting between the main lead portion 112 and the sub-lead portion 114 from taking place.

The plurality of sub-lead portions 114 connect the plurality of light emitting chips 110 spaced by the second space maintaining portions 126b with wires 118. A 2(n−1) number of the plurality of sub-lead portions 114 are formed in the housing if an n (Where, the n is 2 or a natural numeral larger than 2) light emitting chips 110 are housed within the same housing.

The sealing portion 116 is formed by filling a transparent silicone resin in the housing. Accordingly, the sealing portion 116 protects the light emitting chips 110 and the conductive wires 118, and controls a light distribution from the light emitting chips 110.

Figure 4:
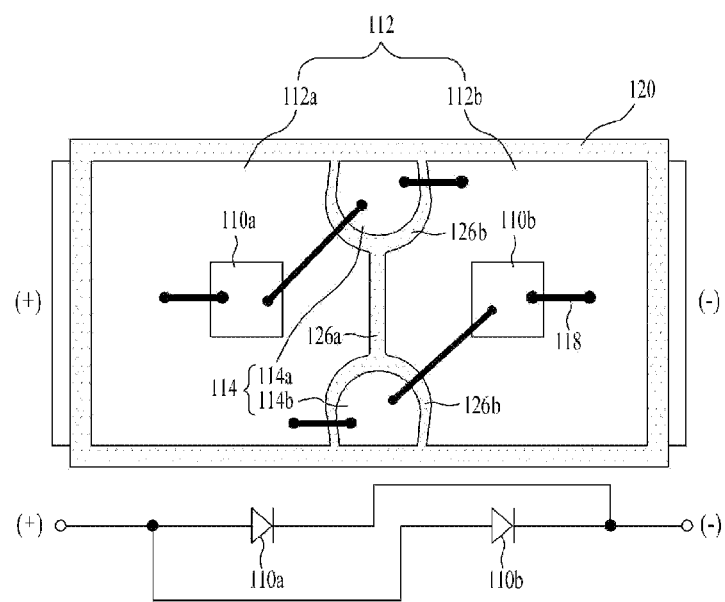
FIG. 4 illustrates a plan view showing a structure in which the light emitting chips in FIG. 1 are connected in parallel.

The light emitting diode package of the present invention has the plurality of light emitting chips 110 within the same housing connected in series or parallel as shown in FIGS. 1, 4 and 5.

Referring to FIG. 1, the first and second light emitting chips 110a, and 110b are connected in series through the first sub-lead portion 114a or the second sub-lead portions 114b. That is, the first light emitting chip 110a has a first terminal connected to an anode through the first main lead portion 112a, and the second light emitting chip 110b has a second terminal connected to a cathode through the second main lead portion 112b, and the first light emitting chip 110a has a second terminal and the second light emitting chip 110b has a first terminal, both connected to the first sub-lead portion 114a or the second sub-lead portion 114b, in common.

Referring to FIG. 4, the first and second light emitting chips 110a, and 110b are connected in parallel through the first and second sub-lead portions 114a, and 114b.

The first light emitting chip 110a has the first terminal connected to the anode through the first main lead portion 112a, and the second light emitting chip 110b has the first terminal connected to the anode through the second sub-lead portion 114b and the first main lead portion 112a.

The second light emitting chip 110b has the second terminal connected to the cathode through the second main lead portion 112b, and the first light emitting chip 110a has the second terminal connected to the cathode through the first sub-lead portion 114a and the second main lead portion 112b.

That is, the first terminals of the first and second light emitting chips 110a, and 110b are connected to the anode in common, and the second terminals of the first and second light emitting chips 110a, and 110b are connected to the cathode, in common.

Referring to FIG. 5, the first to third light emitting chips 110a, 110b, and 110c are connected in parallel through the first to fourth sub-lead portions 114a, 114b, 114c, and 114d.

The first light emitting chip 110a has the first terminal connected to the anode through the first main lead portion 112a, the second light emitting chip 110b has the first terminal connected to the anode through the first sub-lead portion 114a and the first main lead portion 112a, and the third light emitting chip 110c has the first terminal connected to the anode through the first and second sub-lead portions 114a, and 114b and the first main lead portion 112a.

The third light emitting chip 110c has the second terminal connected to the cathode through the third main lead portion 112c, the second light emitting chip 110b has the second terminal connected to the cathode through the third main lead portion 112c and the fourth sub-lead portion 114d, and the first light emitting chip 110a has the second terminal connected to the cathode through the third and fourth sub-lead portions 114c, and 114d and the third main lead portion 112c.

That is, the first terminals of the first to third light emitting chips 110a, 110b, and 110c are connected to the anode in common, and the second terminals of the first to third light emitting chips 110a, 110b, and 110c are connected to the cathode, in common.

Thus, the light emitting diode package in accordance with the first preferred embodiment of the present invention can reduce lengths of the wires 118 connected to the light emitting chips 110 through the sub-lead portions 114. Accordingly, stress applied to the wires 118 at the time of contraction or expansion of the wires 118 caused by heat from a thermal impact test or the light emitting chips 110 can be reduced, enabling to prevent breakage of the wires 118. Moreover, the light emitting diode package in accordance with the first preferred embodiment of the present invention can connect the light emitting chips 110 in series or parallel through the sub-lead portions 114.

Figure 6:
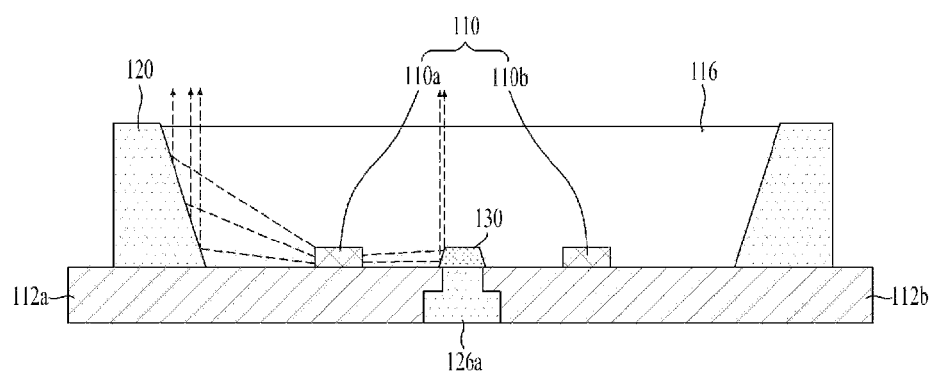
FIG. 6 illustrates a section of a light emitting diode package in accordance with a second preferred embodiment of the present invention.

FIG. 6 illustrates a section of a light emitting diode package in accordance with a second preferred embodiment of the present invention.

The light emitting diode package illustrated in FIG. 6 has elements identical to the light emitting diode package in accordance with the first preferred embodiment of the present invention, except that the light emitting diode package illustrated in FIG. 6 has a reflective portion 130. Accordingly, detailed description of the identical elements will be omitted.

Referring to FIG. 6, the reflective portion 130 is formed on the first space maintaining portion 126a, or the first and second space maintaining portions 126a, and 126b among the plurality of light emitting chips 110 housed in the housing. The reflective portion 130 is formed to have a reflective surface which forms an acute angle to the bottom. In this case, the reflective portion 130 is formed as an isosceles trapezoid, or an isosceles triangle of which two bottom angles are equal.

Of the lights from the plurality of light emitting chips 110, the light emitted toward an adjacent light emitting chip 110 is reflected at the reflective surface of the reflective portion 130 toward a light forwarding side of the sealing portion 116. Accordingly, the reflective portion 130 can reduce the light interferences among the plurality of light emitting chips 110, to improve light efficiency as shown in table 1.

TABLE 1

|  | Without reflective portion | With reflective portion |
| --- | --- | --- |
| Improvement in light flux | 100% | 101.4% |

Referring to FIG. 6, the reflective portion 130 is formed of a material the same with at least any one of the space maintaining portion 126 and the main lead portion 112. The reflective portion 130 formed of the same material with the space maintaining portion 126 may formed at the same time with the space maintaining portion 126 by injection molding.

Figure 7:
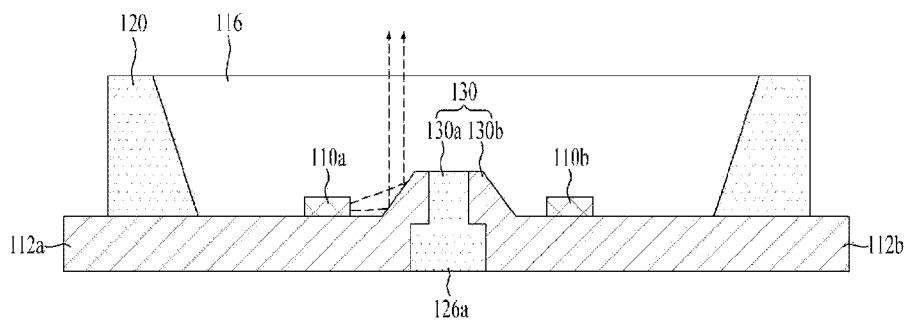
FIG. 7 illustrates a section showing the reflective portion in FIG. 6 in accordance with a preferred embodiment of the present invention.
Figure 8:
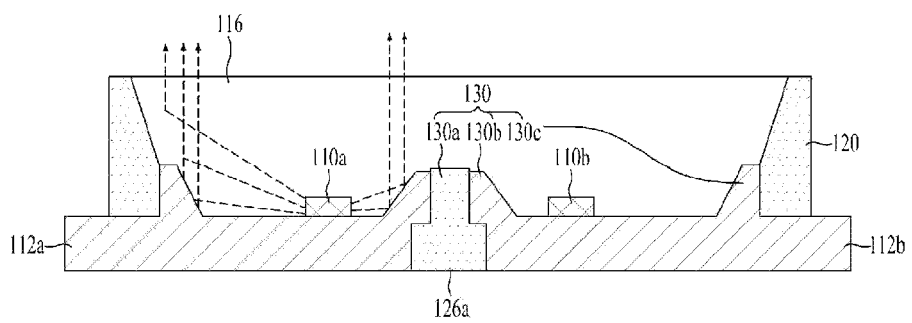
FIG. 8 illustrates a section showing the reflective portion in FIG. 6 in accordance with another preferred embodiment of the present invention.

In the meantime, besides a structure illustrated in FIG. 6, the reflective portion 130 may be formed to have any one of structures in FIGS. 7 and 8.

Referring to FIG. 7, the reflective portion 130 includes a first reflective portion 130a formed on the space maintaining portion 126, and a second reflective portion 130b formed on both sides of the first reflective portion 130a. The first reflective portion 130a is formed of the same material, and at the same time, with the space maintaining portion as one unit with the space maintaining portion. The second reflective portion 130b is formed of the same material, and at the same time, with the main lead portion 112 as one unit with the main lead portion 112 which has higher heat and light resistance than the first reflective portion 130a. The second reflective portion 130b prevents the first reflective portion 130a from altering by the light and heat from the light emitting chips 110.

Referring to FIG. 8, the reflective portion 130 includes a first reflective portion 130a formed on the space maintaining portion 126, a second reflective portion 130b formed on both sides of the first reflective portion 130a, and a third reflective portion 130c formed on a side of the molded portion. The first reflective portion 130a is formed of the same material, and at the same time, with the space maintaining portion as one unit with the space maintaining portion 126. The second reflective portion 130b is formed of the same material, and at the same time, with the main lead portion 112 as one unit with the main lead portion 112 which has higher heat and light resistance than the first reflective portion 130a. The second reflective portion 130b prevents the first reflective portion 130a from altering by the light and heat from the light emitting chips 110. The third reflective portion 130 is formed of the same material, and at the same time, with the second reflective portion 130b as one unit with the main lead portion and the second reflective portion 130b. The third reflective portion 130c prevents the side of the molded portion 120 from discoloring and altering by the light and heat from the light emitting chips 110.

In the meantime, by pressing down the main lead portions 112 at regions excluding regions the light emitting chips 110 are mounted thereto, the second reflective portion 130b in FIG. 7 and the second and the third reflective portions 130b, and 130c are formed, to project the reflective portions 130b, and 130c higher than the main lead portions 112 on which the light emitting chips 110 is mounted, respectively.

Thus, the light emitting diode package in accordance with the second preferred embodiment of the present invention can improve the light efficiency as the light emitting diode package can reduce the light interferences among the light emitting chips 110 owing to the reflective portions 130. Moreover, the reflective portion 130 formed of the same material with the main lead portion 112 having good heat and light resistance can prevent the molded portion from discoloring and altering, thereby improving a lifetime.

As has been described, the light emitting diode package of the present invention has the following advantages.

The connection of the plurality of light emitting chips through the sub-lead portions formed between the plurality of light emitting chips permits to reduce a wire length compared to the related art. Accordingly, stress applied to the wires at the time of contraction or expansion of the wires caused by heat from a thermal impact test or the light emitting chips can be reduced, permitting to prevent breakage of the wires. And, the reduction of the light interferences between the light emitting chips owing to the reflective portion permits to improve the light efficiency, and the reflective portion of a material the same with the main lead portion which has good heat and light resistance permits to prevent the molded portion from discoloring and altering to improve a lifetime thereof.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting diode package comprising:
a molded portion having a housing;
a plurality of light emitting chips housed in the housing;
a plurality of main lead portions on which the plurality of light emitting chips is mounted, respectively; and
at least one sub-lead portion formed spaced from the main lead portions and electrically connected to at least any one of the plurality of main lead portions and the plurality of light emitting chips with wires for electrically connecting the plurality of light emitting chips each other,
wherein the plurality of light emitting chips includes first to third light emitting chips,
wherein the plurality of main lead portions includes a first main lead portion on which the first light emitting chip is mounted, a second main lead portion on which the second light emitting chip is mounted, and a third main lead portion on which the third light emitting chip is mounted,
wherein at least one of the sub-lead portion includes first and third sub-lead portions positioned on both sides of a space between the first and second main lead portions, and second and fourth sub-lead portions positioned on both sides of a space between the second and third main lead portions, and
wherein the first to third light emitting chips are connected in parallel as the first light emitting chip has a first terminal connected to an anode through the first main lead portion, the first light emitting chip has a second terminal connected to a cathode through the third and fourth sub-lead portions and the third main lead portion, the second light emitting chip has a third terminal connected to the anode through the first sub-lead portion and the first main lead portion, the second light emitting chip has a fourth terminal connected to the cathode through the fourth sub-lead portion and the third main lead portion, the third light emitting chip has a fifth terminal connected to the anode through the first and second sub-lead portions and the first main lead portion, and the third light emitting chip has a sixth terminal connected to the cathode through the third main lead portion.

2. The light emitting diode package as claimed in claim 1, further comprising:
first space maintaining portions formed such that the plurality of light emitting chips respectively on the plurality of main lead portions are opposite to one another with one of the first space maintaining portions disposed therebetween; and
second space maintaining portions formed on both sides of each of the first space maintaining portions,
wherein the first and second space maintaining portions are formed of a material that is the same with the molded portion, and each of the second space maintaining portions is formed between each of the plurality of main lead portions and the sub-lead portion, or on a bottom of each of the sub-lead portions between the plurality of main lead portions.

3. The light emitting diode package as claimed in claim 2, wherein the plurality of light emitting chips include first and second light emitting chips, the plurality of main lead portions include a first main lead portion on which the first light emitting chip is mounted, and a second main lead portion on which the second light emitting chip is mounted, and at least one of the sub-lead portion includes first and second sub-lead portions positioned on both sides of a space between the first and second main lead portions.

4. The light emitting diode package as claimed in claim 3, wherein the first and second light emitting chips are connected in series as the first light emitting chip has a first terminal connected to an anode through the first main lead portion, the first light emitting chip has a second terminal and the second light emitting chip has a first terminal, both connected to the first sub-lead portion or the second sub-lead portion, and the second light emitting chip has the second terminal connected to a cathode through the second main lead portion, and the first and second light emitting chips are connected in parallel as the first light emitting chip has the first terminal connected to the anode through the first main lead portion, the first light emitting chip has the second terminal connected to the cathode through the first sub-lead portion and the second main lead portion, the second light emitting chip has the first terminal connected to the anode through the second sub-lead portion and the first main lead portion, and the second light emitting chip has the second terminal connected to the cathode through the second main lead portion.

5. The light emitting diode package as claimed in claim 2, further comprising a reflective portion formed of a material that is the same with the molded portion or the main lead portion on the first space maintaining portion or the first and second space maintaining portions.

6. The light emitting diode package as claimed in claim 2, further comprising a first reflective portion formed of a material that is the same with the molded portion on the first space maintaining portion or the first and second space maintaining portions, and a second reflective portion formed of a material that is the same with the main lead portion as one unit with the main lead portion on a reflective surface of the first reflective portion.

7. The light emitting diode package as claimed in claim 6, further comprising a third reflective portion formed of a material that is the same with the main lead portion as one unit with the main lead portion on a side of the molded portion.

8. The light emitting diode package as claimed in claim 7, wherein the second and third reflective portions are projected higher than an upper side of the main lead portion on which the light emitting chip is mounted.

* * * * *